(12) United States Patent
Brighton

(10) Patent No.: US 6,448,121 B1
(45) Date of Patent: Sep. 10, 2002

(54) HIGH THRESHOLD PMOS TRANSISTOR IN A SURFACE-CHANNEL PROCESS

(75) Inventor: Jeffery Brighton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 12 days.

(21) Appl. No.: 09/584,625

(22) Filed: May 31, 2000

(51) Int. Cl.⁷ .................. H01L 21/336; H01L 21/8238
(52) U.S. Cl. ........................ 438/197; 438/282
(58) Field of Search ................ 438/197, 217, 438/231, 232, 266, 288, 301, 303, 304, 305, 306, 228, 282, 289, 299, 332, 383, 914

(56) References Cited

U.S. PATENT DOCUMENTS

| | | | |
|---|---|---|---|
| 4,943,537 A | * 7/1990 | Harrington, III | 438/231 |
| 5,122,474 A | * 6/1992 | Harrington, III | 438/305 |
| 5,580,804 A | * 12/1996 | Joh | 438/231 |
| 5,682,051 A | * 10/1997 | Harrington, III | 257/369 |

* cited by examiner

Primary Examiner—David Nelms
Assistant Examiner—David Nhu
(74) Attorney, Agent, or Firm—Gerald E. Laws; W. James Brady, III; Frederick J. Telecky, Jr.

(57) ABSTRACT

A buried-channel PMOS device is fabricated simultaneously with a surface-channel device if the gate is doped N-type while the NMOS gates are doped and the P+ source/drain doping is blocked from the "high" P-channel device. In the normal process the "high" PMOS is not fully self-aligned. However, when the PMOS process includes a lightly-doped drain (PLDD), the LDD doping is self-aligned.

13 Claims, 6 Drawing Sheets

HIGH THRESHOLD PMOS TRANSISTOR IN A SURFACE-CHANNEL PROCESS

FIELD OF THE INVENTION

The invention relates to integrated circuits, and more particularly to a high threshold PMOS transistor utilizing a surface-channel process.

BACKGROUND OF THE INVENTION

In certain integrated circuit designs, a PMOS transistor with high $V_t$ is required to guarantee a zero through-current in normal circuit operation. This has been accomplished by the use of a "natural" $V_t$ buried channel PMOS device. However most present day CMOS technology uses surface-channel PMOS transistors, therefore an alternative method is required.

For traditional "buried-channel" PMOS devices, the high $V_t$ is easy to make. When the PMOS gate material is N+-doped polysilicon, a boron $V_t$ adjust implant is usually required to reduce the $V_t$ to the desired voltage, the "natural" $V_t$ (without $V_t$-adjustment implant) is too high for optimum circuit performance. For a buried-channel PMOS process, the $V_t$-adjust implant may be blocked from those transistors that need the high $V_t$, and both high and low $V_t$ devices are produced simultaneously. If the natural PMOS $V_t$ is too high, an extra mask and implant will produce a device with the correct $V_t$. For surface-channel PMOS devices, obtaining high $V_t$ is more difficult. For these devices, the PMOS gate is P+ doped, so the "natural" device has a very low $V_t$.

SUMMARY OF THE INVENTION

The invention provides a method for building high $V_t$ PMOS devices in an otherwise surface-channel process without adding any process steps. A buried-channel PMOS device is fabricated simultaneously with a surface-channel device if the gate is doped N-type while the NMOS gates are doped and the P+ source/drain doping is blocked from the "high" P-channel device. In the normal process the "high" PMOS is not fully self-aligned. However, when the PMOS process includes a lightly-doped drain (PLDD), the LDD doping is self-aligned.

DESCRIPTION OF A PREFERRED EMBODIMENT

Figure 1:
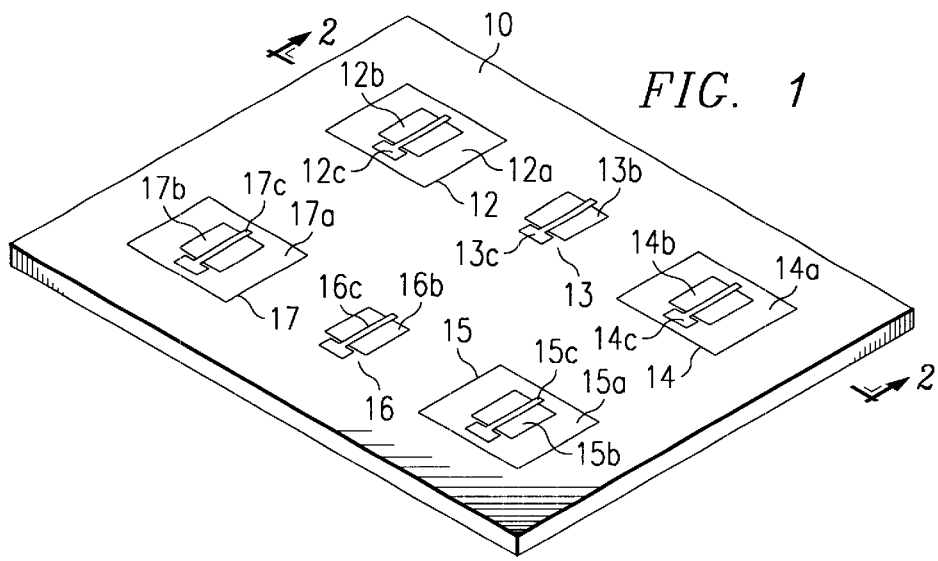
FIG. 1 shows a P substrate of silicon with N-wells, and six devices.

FIG. 1 shows a P-type substrate 10 of silicon having six devices 12–17 formed thereon. Devices 12, 14, 15 and 17 are PMOS devices, and devices 13 and 16 are NMOS devices. Each of PMOS devices 12, 14, 15 and 17 are formed in N-wells (also called N-Tanks) 12a, 14a, 15a and 17a, respectively. NMOS devices are formed directly into substrate 10.

Each device has a moat area and a gate. For example, the moat areas of devices 12, 14, 15, and 17 are 12b, 14b, 15b, and 17b, respectively, and the gates are 12c, 14c, 15c and 17c, respectively. Devices 13 and 16 utilize the substrate 10 as the tank area. Devices 13 and 16 have moats 13b and 16b, respectively, and gates 13c and 16c, respectively.

FIGS. 2–21 show, for example, the formation of three devices as it would appear in a cross-sectional view taken along section line 2—2.

Figure 2:
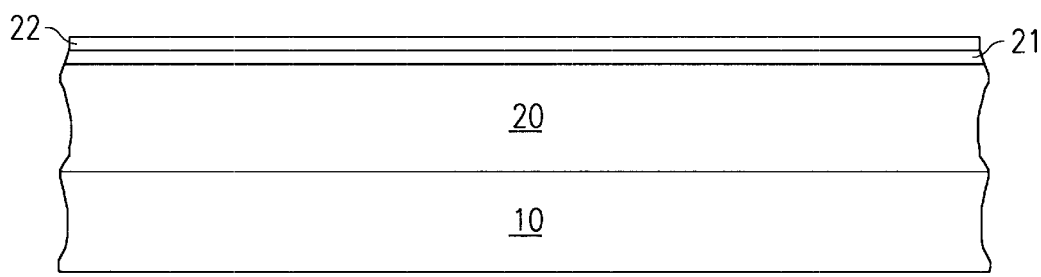
FIGS. 2 through 21 show the process steps for forming an NMOS and PMOS surface channel device, and a PMOS buried channel device according to the present invention.

FIG. 2 shows substrate 10 which is, for example, a p-type silicon substrate, boron doped. Substrate portion 20 may be, for example, a p-epi silicon, boron doped layer. A first oxide pad 21 is formed over p-layer 20. Oxide pad 21 may be in the range of 370 to 490 Å in thickness.

On top of oxide pad 21 is formed a nitride layer 22. Nitride layer 22 may be a thickness in the range of 900 to 1500 Å.

Figure 3:
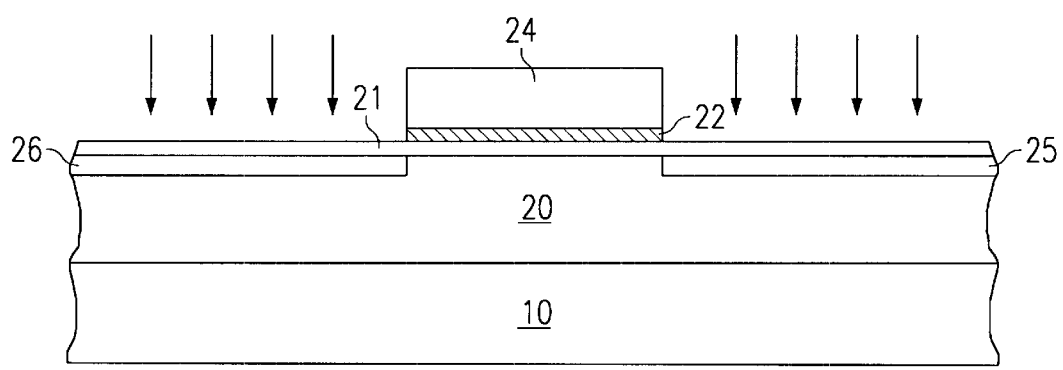

FIG. 3 shows an initial process step for forming three devices. A layer of photoresist material 24 is placed over the central portion of nitride layer 22. Portions of nitride layer 22 have been removed, the portion under photoresist 24 is not removed. An N-tank phosphorus implant is made through the oxide pad 21 to form two N-tanks 25,26 in the surface of layer 20.

Figure 4:
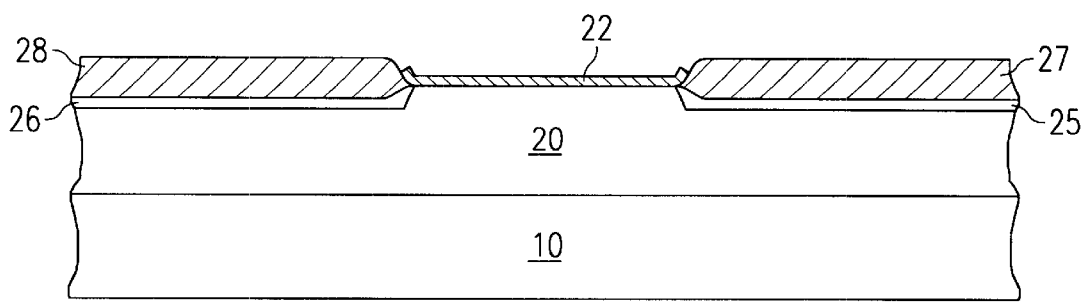

FIG. 4 shows the two N-tank regions 25,26 in layer 20. The photoresist layer 24, (FIG.3) has been removed by, for example, a plasma $O_2$ removal process, exposing the nitride layer 22, and a tank oxide 27, 28 is formed over the N-tank regions 25, 26, respectively. Tank oxide layers 27,28 may have, for example, a thickness in the range of 3800 to 5200 Å.

Figure 5:
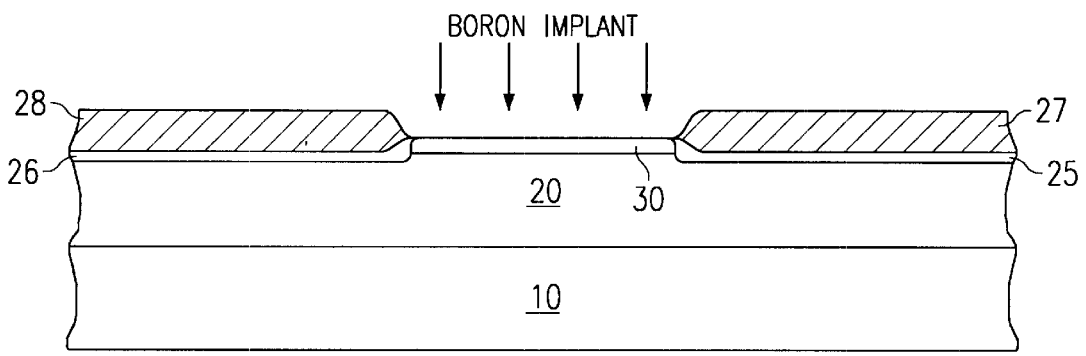

FIG. 5 shows the next step in the process where nitride layer 22 has been removed, for example, by a phosphoric acid etch process. A boron implant is made to form P-tank 30. The device now has two N-Tanks 25 and 26, which may correspond to N-Tanks 12a and 14a in FIG. 1, and P-Tank 30 is the area on device 10 between 12a and 14a in FIG. 1.

Figure 6:
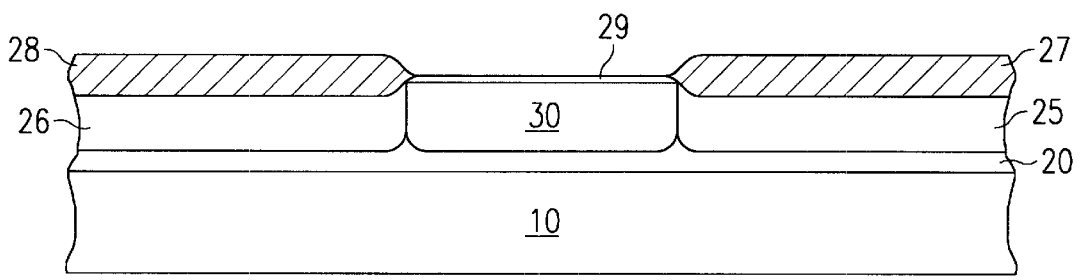

After P-Tank 30 has been formed, the substrate is annealed at a high temperature so that the N-tank and P-tank regions diffuse to the desired depth, as shown in FIG. 6. N-Tanks 25 and 26 on each side of P-Tank 30, are covered with tank oxide layers 27 and 28 respectively. P-tank 30 has a layer 29 of pad oxide over its surface.

Figure 7:
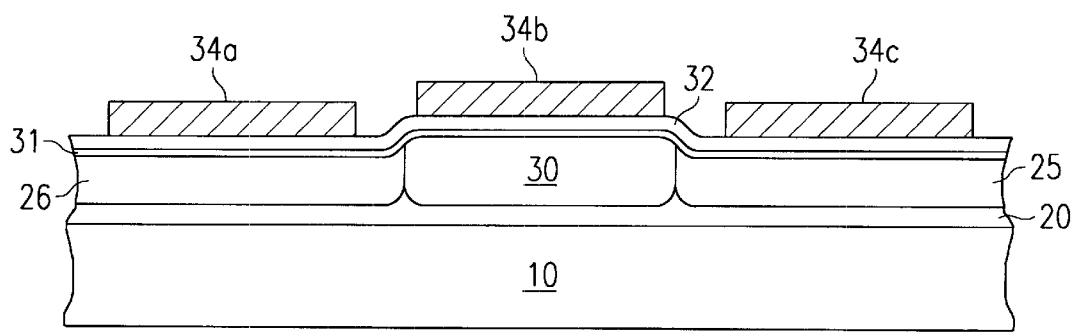
Figure 8:
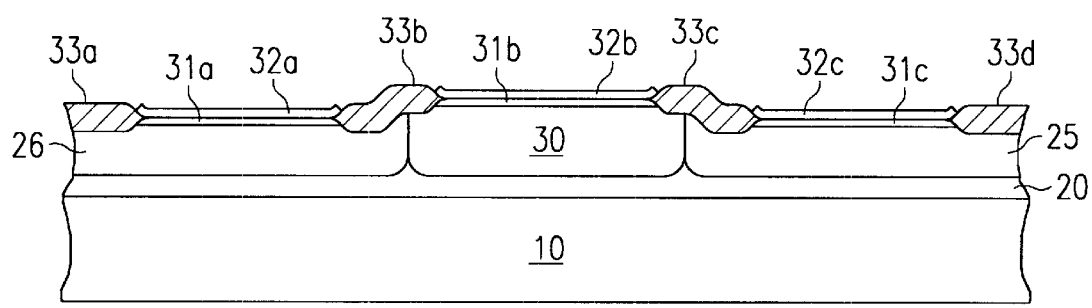

In FIG. 7, the tank oxide layers 27 and 28 are removed over a central portions of each of N-Tanks 25 and 26 and P-Tank 30. An isolation pad oxide 31 is formed over the N-tanks 25 and 26, and P-tank 30. Isolation oxide pad may be, for example, in the range of 125 to 175 Å. Isolation nitride layer 32, for example in the range of 1800 to 2200 Å thick is then deposited over pad oxide layer 31. Photoresist is deposited and portions are removed to form photoresist layers 34a, 34b, 34c. The nitride layer 32 is then etched to form nitride pads 32a, 32b, and 32c over each tank region 25, 26 and 30. After forming the nitride pads 32a, 32b and 32c, the device is subjected to an oxidation process which includes heating the device in an $N_2$ atmosphere in a temperature range, for example, of 750° to 950° followed by a steam oxidation process. This forms the field oxide regions shown in FIG. 8 and indicated at 33a, 33b, 33c and 33d.

Figure 9:
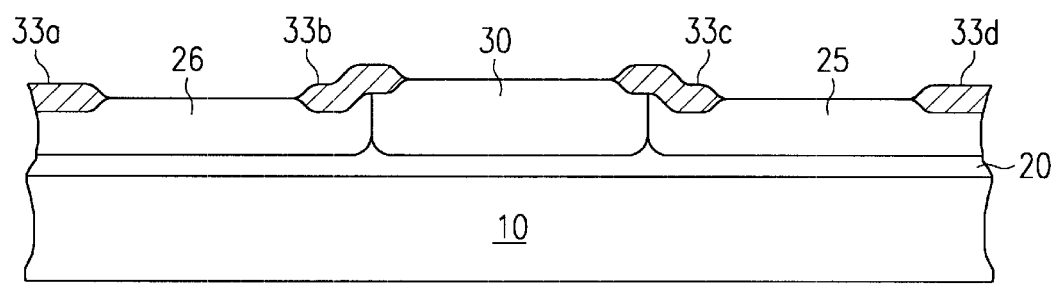

FIG. 9 shows the next step in the process where nitride pads 32a, 32b and 32c and pad oxide regions 31a, 31b and 31c have been removed using phosphoric acid followed by a HF wet etch.

Figure 10:
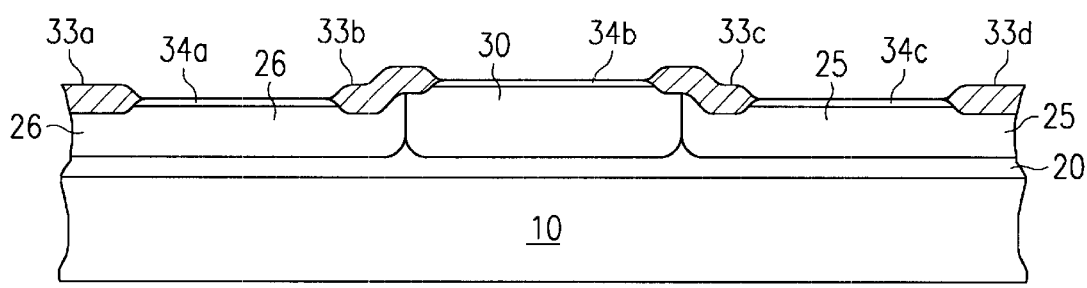

In the etch and cleaning process, when nitride pads 32a, 32b and 32c are removed, the pad oxide layers 31a–31c (FIG. 8) are removed. FIG. 10 shows layers of dummy gate oxide, layers 34a, 34b and 34c, that are formed, for example, by heating between 750° and 950° followed by a steam oxidation process.

Figure 11:
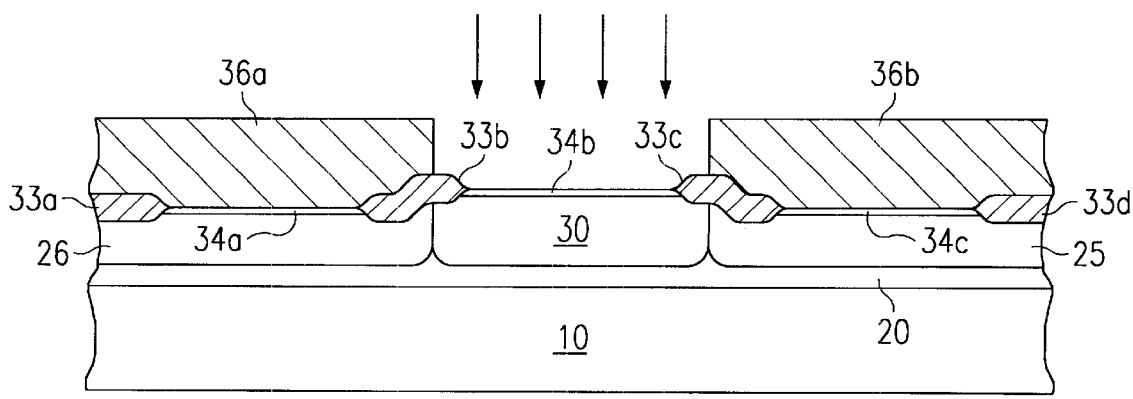

Next, in FIG. 11, a layer of photoresist 36a, 36b is deposited over each of the N-tank regions 25 and 26, but P-tank 30 is exposed. A $V_t$ implant for the NMOS device (VTN) is made to the P-tank region 30 to set the threshold voltage, an NMOS device implant for punch through (NPTHRU) is made to prevent bulk punch through in the N channel, and a Channel stop implant is made to set the field voltage. These three implants are made with boron.

Figure 12:
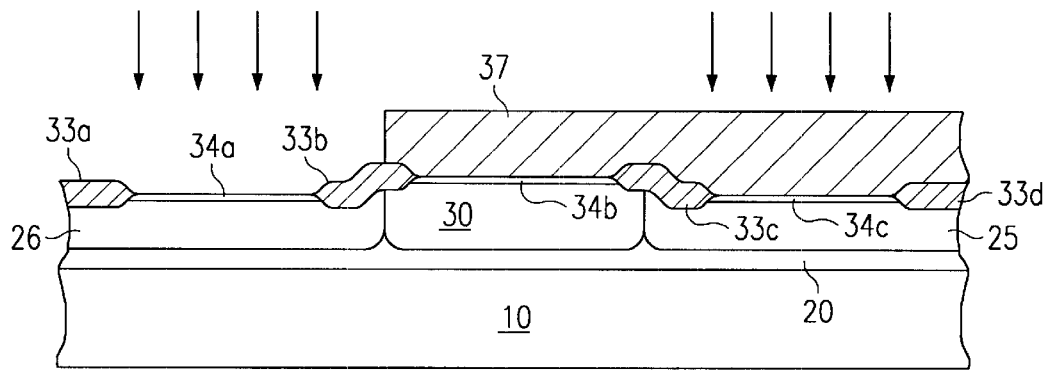

The photoresist layers 36a and 36b are removed and a photoresist layer 37 is formed over the P-tank 30 and the high $V_t$ PMOS N tank region 25 as shown in FIG. 12. Two implants are made with phosphorus, a $V_t$ implant for the PMOS device (VTP) to set P-channel threshold voltages, and a PMOS device implant for punch through (PPTHRU) to prevent bulk punch through in the P-channel.

Figure 13:
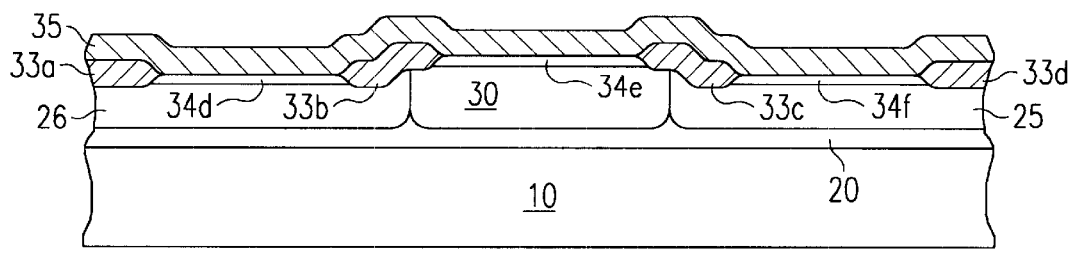

Next, the photoresist 37 is removed. The dummy gate oxide gate 34a–34c is etched and oxide gate 34d–34f is grown over the tank surfaces (tanks 25, 26 and 30). Then a polysilicon layer 35 is deposited over each tank area (FIG. 13). The polysilicon layer 35 may be, for example, a thickness between 2800 and 3400 Å.

Figure 13A:
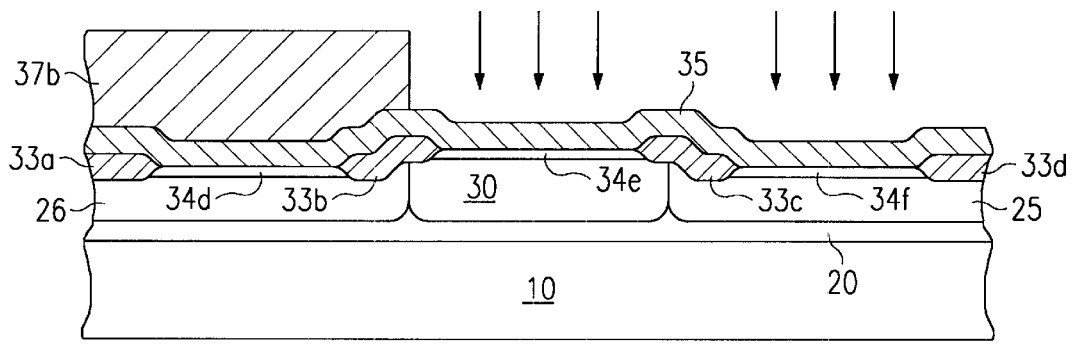

FIG. 13a shows layer of photoresist 37b over tank region 26. An NPOLY phosphorus implant is made into polysilicon 35 except the part over N-tank 26. This provides N-type doping in the polysilicon over P-tank region 30 and N-tank region 25.

Figure 14:
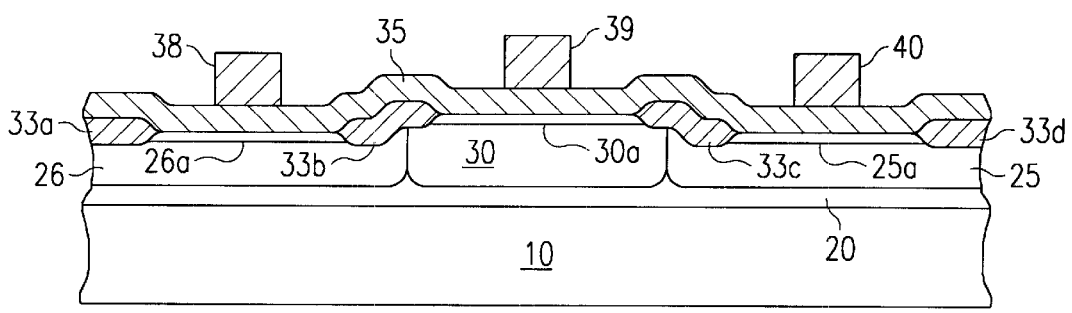

After the phosphorus implant, (FIG. 13a), photoresist 37b over tank region 26 is removed and photoresist material is deposited on the polysilicon and patterned to form the regions 38, 39 and 40, over the central regions 26a, 30a and 25a of the N☐ and P-tanks 25, 30 and 25, respectively. This is shown in FIG. 14. The polysilicon 35 is etched to remove all the polysilicon over the P-tank and N-tank regions except those regions that were under the photoresist areas 38, 39 and 40.

After the etch process, polysilicon gate electrodes 41, 42, and 43 remain on N-tank 25, P-tank 30, and N-tank 26, respectively. Each polysilicon gate electrode may be, for example, in the range of 2800 to 3400 Å in thickness. A thin coating of oxide 41a, 42a and 43a is formed over each respective polysilicon gate electrode 41–43. This oxide may be in the range, for example, of 75 to 85 Å thick (FIG. 15).

Figure 15:
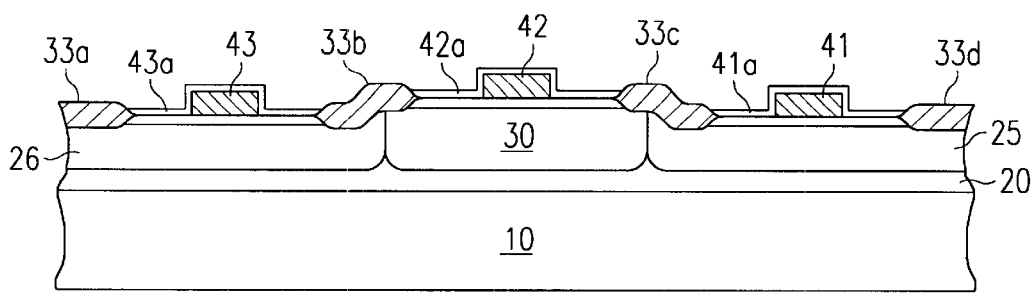
Figure 16:
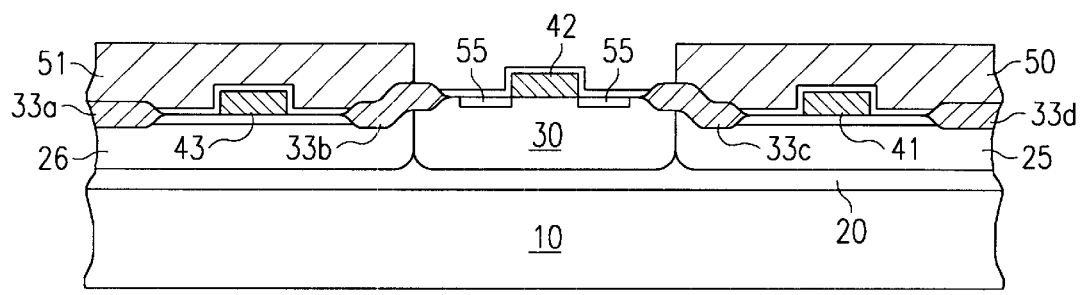

FIG. 16 shows the device of FIG. 15 with the two N-tanks 25 and 26 covered with photo resist 50 and 51, respectively. In this step of the process the source/drain region of the P-tank is implanted with phosphorus and arsenic. This is the N-LDD (Lightly Doped Drain) implant. The implanted region 55 is shown in FIG. 16.

Figure 17:
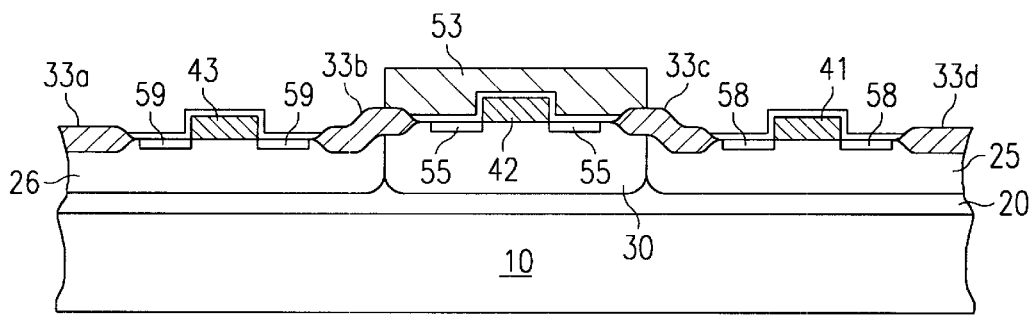

In FIG. 17, the P-tank region is covered with photoresist 53 and the N-tank regions 25 and 26 are implanted with boron to form the source/drain regions 58 and 59. This is the P-LDD (Lightly Doped Drain) implant.

Figure 18:
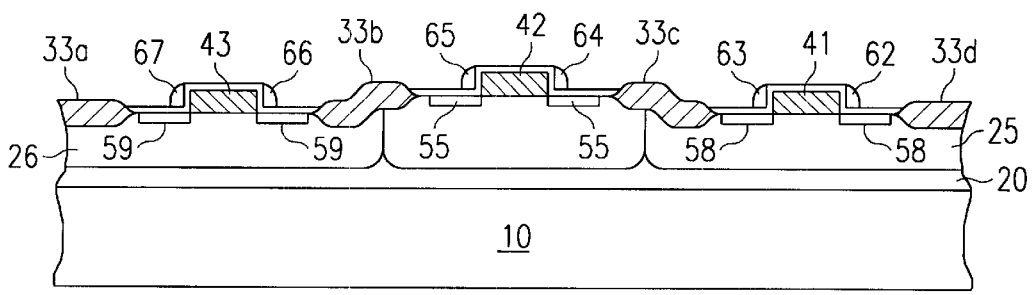

FIG. 18 shows the device of FIG. 17 after nitride has been deposited on the device surface and anisotropically etched back to form oxide/nitride around each of the polysilicon electrodes 43, 42, and 41. The oxide/nitride spacers 62–67 are used for self-aligned silicide formation as well as allowing self-aligned source/drain implants.

Figure 19:
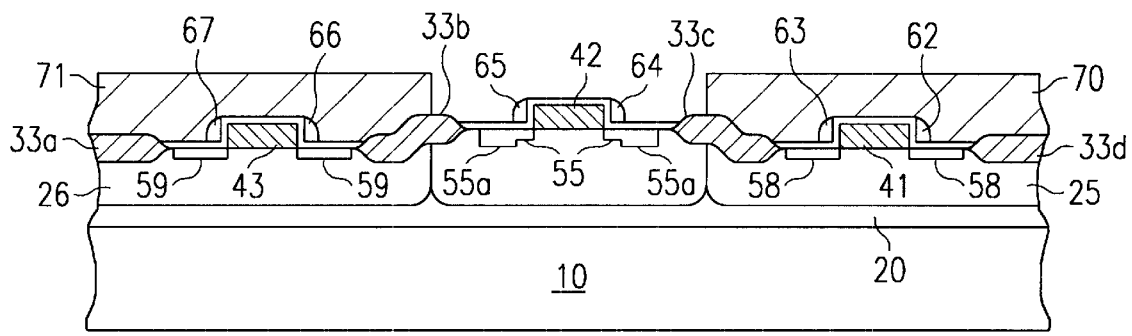

In FIG. 19, the N-tank regions are covered with photoresist at 70 and 71. An arsenic and/or phosphorus N+ source/drain implant is made to allow grading of the N+/P junctions. The step or grading is shown at 55/55a, with the 55a region being the N+ implant region.

Figure 20:
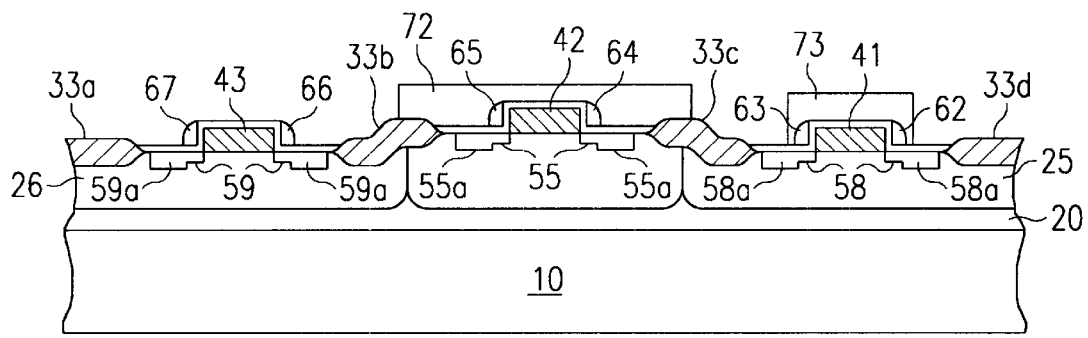

In FIG. 20, a layer of photoresist is placed over the P-tank region. A layer of photoresist is placed over the gate electrode 41 on the N-tank 25. However, there is no photoresist over gate electrode 43 on N-tank 26. A P+ source/drain boron implant is made over the N-tank region 26. Photoresist layer 73 blocks the source/drain implant from gate electrode 41 and may provide an extended P region 58 when compared with the P region 59. The P+ regions 58a and 59a are a result of the P+ implant.

Figure 21:
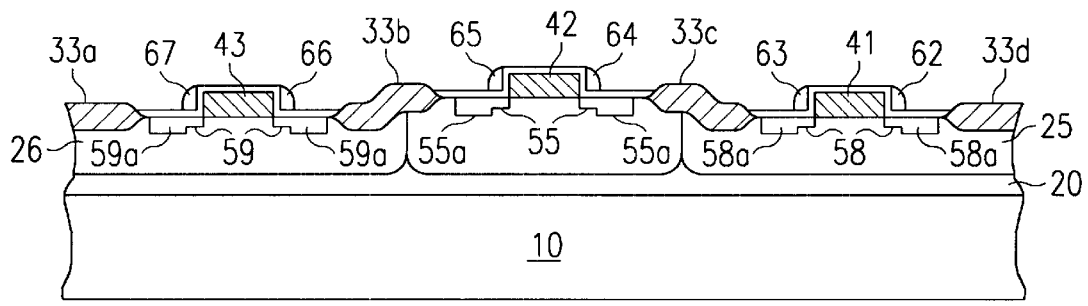

FIG. 21 shows the photoresist layers 72 and 73 removed, and the resulting device PLDD (P Lightly Doped Drain) in N-Tank 25. The P source/drain has been blocked to proved the lightly doped region 58. The LLD is self-aligned and provides a high Vt PMOS device in an otherwise surface channel process without adding additional process steps.

What is claimed is:

1. A process of forming a naturally high $V_t$ P-MOS device simultaneously with N-MOS and P-MOS surface channel devices, comprising the steps of:
    forming N-tank regions;
    forming P-tank regions;
    forming transistor regions within the N-tank and P-tank regions;
    implanting P-type doping ions near the surface of the P-tank regions;
    implanting N-type doping ions near the surface of at least one of the transistor regions within the N-tank regions;
    forming gate oxide on each of the transistor regions;
    forming N-type polysilicon gate electrodes on the transistor regions in P-tank and N-tank regions while simultaneously forming at least one of undoped and P-type polysilicon gate electrode over other transistor regions within N-tank regions;
    implanting n-type doping ions into P-tank regions to form N-MOS transistor source/drain regions; and
    implanting p-type doping ions into N-tank regions to form P-MOS transistor source/drain regions while intentionally blocking the majority of the implant ions from penetration into the N-type polysilicon gate electrodes within N-tank regions.

2. The process according to claim 1, including the step of: forming a coating of oxide over each gate electrode.

3. The process according to claim 1, including the wherein the oxide/nitride region around each of the gate electrodes is formed by depositing and anisotropically etching the nitride.

4. The process according to claim 1, including the step of forming isolation nitride pads over the tank regions prior to forming the field oxide regions.

5. The process according to claim 1, after forming N-tank and P-tank regions, forming field oxide regions between adjacent tank regions.

6. A process of forming a P-MOS buried channel device simultaneously with N-MOS and P-MOS surface channel devices, comprising the steps of:
    implanting phosphorus to form two N-tank regions;
    implanting boron to from a P-tank region;
    forming isolation nitride pads over the tank regions;
    forming field oxide regions between adjacent tank regions;
    forming gate oxide on each of the tank regions;
    implanting boron into the P-tank region;
    implanting phosphorus into one of the two N-tank regions;
    forming N-type polysilicon gate electrodes on the P-tank and one of the N-tank regions and at least one of an undoped and P-type polysilicon gate electrode on the other N-tank region;
    implanting the P-tank with one of phosphorus and arsenic to form lightly doped source/drain regions;

implanting the N-tank with boron to form lightly doped source/drain regions;

forming a oxide/nitride region around each of the gate electrodes;

implanting the P-tank with at least one of phosphorus and arsenic to from N-type source/drain regions: and implanting boron to from P-Type source/drain in the two N-tanks while blocking the implant from the N-type polysilicon gate electrode contained therein.

7. The process according to claim 6, including the step of:

forming a coating of oxide over each gate electrode.

8. The process according to claim 6, including the wherein the oxide/nitride region around each of the gate electrodes is formed by depositing and anisotropically etching the nitride.

9. A process of forming a naturally high $V_t$ P-MOS device simultaneously with N-MOS and P-MOS surface channel devices, comprising the steps of:

implanting phosphorus to form N-tank regions;

implanting boron to from P-tank regions;

forming field oxide regions between adjacent tank regions;

forming gate oxide on each of the tank regions;

implanting boron into the P-tank region;

implanting phosphorus into one the two N-tank regions;

forming N-type polysilicon gate electrodes on the P-tank and one of the N-tank regions and at least one of an undoped and P-type polysilicon gate electrode on the other N-tank region;

implanting the P-tank with one of phosphorus and arsenic to form lightly doped source/drain regions;

implanting the N-tank with boron to form lightly doped source/drain regions;

forming a oxide/nitride region around each of the gate electrodes;

implanting the P-tank with one of phosphorus and arsenic to form N-type source/drain regions; and implanting boron to form P-type source/drains in the two N-tanks while blocking the implant from the N-type polysilicon gate electrode contained therein.

10. A process for forming a naturally high $V_t$ PMOS device in an integrated circuit comprising mainly of NMOS and PMOS surface channel devices without using additional process steps, comprising the steps of:

a) forming a semiconductor substrate with a plurality of N-type regions each for containing a PMOS device and a plurality of P-type regions each for containing an NMOS device, with suitable isolation regions therebetween;

b) forming an insulated polysilicon gate electrode in each of the plurality of N-type regions for the PMOS devices and for the high $V_t$ PMOS devices and in each of the plurality of P-type regions for the NMOS devices;

c) implanting an n-type dopant in the polysilicon gate electrodes for the NMOS devices and for the high $V_t$ PMOS devices using a same implant step to form N+ polysilicon gate electrodes;

d) implanting a p-type dopant in the polysilicon gate electrodes for the PMOS devices to form P+ polysilicon gate electrodes;

e) implanting an n-type dopant to form lightly-doped-drain extension regions and source-drain regions for the NMOS devices; and f) implanting a p-type dopant to form lightly-doped-drain extension regions and source-drain regions for the PMOS devices and for the high $V_t$ PMOS devices.

11. The method of claim 10, wherein step b comprises the steps of forming a layer of polysilicon over the semiconductor substrate and patterning the polysilicon layer to form a plurality of polysilicon gate electrodes; and wherein step c is performed prior to the step of patterning the polysilicon layer by masking regions of the polysilicon layer that correspond to the PMOS devices but not to the high $V_t$ PMOS devices.

12. The method of claim 10, wherein step d and step f are performed using the same implant steps.

13. The method of claim 10, wherein during step f, the N+ polysilicon gate electrodes of the high $V_t$ PMOS devices are masked to prevent p-type dopant implantation therein.

* * * * *